United States Patent
Liu et al.

(10) Patent No.: US 10,720,506 B1
(45) Date of Patent: Jul. 21, 2020

(54) METHOD OF MANUFACTURING GATE STRUCTURE FOR GALLIUM NITRIDE HIGH ELECTRON MOBILITY TRANSISTOR

(71) Applicant: Excelliance MOS Corporation, Hsinchu County (TW)

(72) Inventors: Chu-Kuang Liu, Hsinchu County (TW); Hung-Kun Yang, Hsinchu County (TW)

(73) Assignee: Exvelliance MOS Corporation, Hsinchu County (TW)

( * ) Notice: Subject to any disclaimer, the term of this patent is extended or adjusted under 35 U.S.C. 154(b) by 0 days.

(21) Appl. No.: 16/361,217

(22) Filed: Mar. 22, 2019

(30) Foreign Application Priority Data

Dec. 26, 2018 (TW) ................. 107147081 A (51) Int. Cl.
| | |
|---|---|
| *H01L 29/66* | (2006.01) |
| *H01L 21/308* | (2006.01) |
| *H01L 21/02* | (2006.01) |
| *H01L 29/778* | (2006.01) |
| *H01L 29/20* | (2006.01) |
| *H01L 29/205* | (2006.01) |
| *H01L 29/45* | (2006.01) |
| *H01L 21/311* | (2006.01) |
| *H01L 21/283* | (2006.01) |

(52) U.S. Cl.
CPC .... *H01L 29/66462* (2013.01); *H01L 21/0254* (2013.01); *H01L 21/0262* (2013.01); *H01L 21/02271* (2013.01); *H01L 21/283* (2013.01); *H01L 21/3086* (2013.01); *H01L 21/31105* (2013.01); *H01L 29/2003* (2013.01); *H01L 29/205* (2013.01); *H01L 29/452* (2013.01); *H01L 29/7786* (2013.01)

(58) Field of Classification Search
None
See application file for complete search history.

(56) References Cited

U.S. PATENT DOCUMENTS

| | | | | |
|---|---|---|---|---|
| 5,205,905 | A * | 4/1993 | Kotaki | H01L 21/28575 257/E21.172 |
| 6,867,078 | B1 * | 3/2005 | Green | H01L 29/42316 257/183 |
| 9,318,593 | B2 | 4/2016 | Wu et al. | |
| 9,425,301 | B2 | 8/2016 | Chiu et al. | |
| 2007/0267655 | A1 * | 11/2007 | Endoh | H01L 29/66462 257/194 |

(Continued)

*Primary Examiner* — Nilufa Rahim
(74) *Attorney, Agent, or Firm* — JCIPRNET (57) ABSTRACT

A method of manufacturing a gate structure for gallium nitride (GaN) high electron mobility transistor (HEMT) includes orderly forming a channel layer, a barrier layer, a doped GaN layer, an undoped GaN layer, and an insulating layer on a substrate, and then removing a portion of the insulating layer to form a trench. A gate metal layer is formed on the substrate to cover the insulating layer and the trench, and then a mask layer aligned with the trench is formed on the gate metal layer, wherein the mask layer partially overlaps the insulating layer. By using the mask layer as an etching mask, the exposed gate metal layer and the underlying insulating layer, the undoped GaN layer and the doped GaN layer are removed, and then the mask layer is removed.

10 Claims, 6 Drawing Sheets

(56) References Cited

U.S. PATENT DOCUMENTS

| | | | |
|---|---|---|---|
| 2011/0049526 A1* | 3/2011 | Chu | H01L 21/283 |
| | | | 257/76 |
| 2012/0313106 A1 | 12/2012 | He | |
| 2013/0099245 A1* | 4/2013 | Ando | H01L 29/4232 |
| | | | 257/76 |
| 2014/0092636 A1* | 4/2014 | Kanamura | H01L 29/4966 |
| | | | 363/17 |
| 2014/0159119 A1* | 6/2014 | Derluyn | H01L 29/66462 |
| | | | 257/194 |
| 2017/0200817 A1* | 7/2017 | Curatola | H01L 22/26 |
| 2017/0317179 A1 | 11/2017 | Cao et al. | |
| 2017/0330950 A1* | 11/2017 | Anderson | H01L 29/402 |
| 2018/0083133 A1* | 3/2018 | Bayram | H01L 29/7786 |
| 2018/0218910 A1* | 8/2018 | Harada | H01L 29/0684 |

* cited by examiner

METHOD OF MANUFACTURING GATE STRUCTURE FOR GALLIUM NITRIDE HIGH ELECTRON MOBILITY TRANSISTOR

CROSS-REFERENCE TO RELATED APPLICATION

This application claims the priority benefit of Taiwan application serial no. 107147081, filed on Dec. 26, 2018. The entirety of the above-mentioned patent application is hereby incorporated by reference herein and made a part of specification.

BACKGROUND

Technical Field

The present disclosure relates to a technique of high electron mobility transistor (HEMT), and more particularly to a method for manufacturing a gate structure for a gallium nitride HEMT.

Description of Related Art

In gallium nitride high electron mobility transistor (HEMT), a heterogeneous structure including aluminum gallium nitride (AlGaN) and gallium nitride (GaN) is utilized to generate two-dimensional electron gas (2DEG) having high planar charge density and high electron mobility at the junction therebetween, and thus the gallium nitride HEMT is suitable for operation under high power, high frequency and high temperature.

The gallium nitride HEMT with a high concentration of 2DEG adopts a normally-off circuit design. However, serious leakage at gate has occurred in such a gallium nitride HEMT, which causes low or fail switch of transistor under abnormal operation, resulting in low reliability.

SUMMARY

The disclosure provides a method for manufacturing a gate structure for gallium nitride high electron mobility transistor (HEMT), which is capable of producing an HEMT with low gate leakage.

The method for manufacturing a gate structure for gallium nitride HEMT includes orderly forming a channel layer, a barrier layer, a doped gallium nitride layer, and an undoped gallium nitride layer on a substrate, and then forming an insulating layer on the undoped gallium nitride layer, forming a trench by removing a portion of the insulating layer, forming a gate metal layer on the substrate, covering the insulating layer and the trench, and then forming a mask layer aligned with the trench on the gate metal layer, wherein the mask layer partially overlaps the insulating layer. By using the mask layer as an etching mask, the exposed gate metal layer and the underlying insulating layer, the undoped gallium nitride layer and the doped gallium nitride layer are removed, and then the mask layer is removed.

In an embodiment of the disclosure, the overlapping area of the mask layer and the insulating layer accounts for 50% or less of the area of the mask layer.

In an embodiment of the disclosure, the step of removing a portion of the insulating layer may further be followed by removing the exposed undoped gallium nitride layer to deepen the trench and expose the doped gallium nitride layer.

In an embodiment of the disclosure, the formed gate metal layer may be in direct contact with the doped gallium nitride layer in the trench.

In an embodiment of the disclosure, a method of forming the channel layer, the barrier layer, the doped gallium nitride layer, and the undoped gallium nitride layer includes, for example, metal organic chemical vapor deposition (MOCVD).

In an embodiment of the disclosure, the method of forming the above insulating layer includes, for example, metal organic chemical vapor deposition or low pressure chemical vapor deposition (LPCVD).

In an embodiment of the present disclosure, the step of forming the channel layer may further be preceded by forming a first buffer layer on the substrate, and then forming a second buffer layer on the first buffer layer, wherein the lattice of the second buffer layer is more matching with the channel layer than the lattice of the first buffer layer.

In an embodiment of the disclosure, the first buffer layer is, for example, an aluminum nitride layer, and the second buffer layer is, for example, a multi-stack layer of aluminum gallium nitride ($Al_xGa_{1-x}N$, x=0.2-1) and gallium nitride.

In an embodiment of the disclosure, the first and second buffer layers are formed by, for example, metal organic chemical vapor deposition.

In an embodiment of the disclosure, the step of removing the mask layer may further be followed by forming a passivation layer which completely covers the gate metal layer, the insulating layer, the undoped gallium nitride layer, the doped gallium nitride layer and the barrier layer.

Based on the above, according to the present disclosure, the insulating layer is formed on both sides of the gate metal layer by two photomask processes that are nearly complementary to each other, so that the current leakage at the side of gate can be blocked through the insulating layer, and the doped gallium nitride layer can be protected by the undoped gallium nitride layer that can grow together with the channel layer, the barrier layer and the doped gallium nitride layer, thereby ensuring that the doped gallium nitride layer is not affected by the subsequent manufacturing process of gate metal layer and/or source and drain. Therefore, the gate structure manufactured by the present disclosure can improve the reliability of a gallium nitride HEMT.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

The drawings in the following embodiments are exemplary embodiments intended to provide a more complete description of the disclosure, but the disclosure may be implemented in many different forms and should not be construed as being limited to the provided embodiments. In the drawings, the relative thickness and location of layers, regions, and/or structural elements may be reduced or exaggerated for clarity.

FIGS. 1A-1G are schematic cross-sectional views showing a manufacturing process of a gate structure for a gallium nitride high electron mobility transistor (HEMT) according to an embodiment of the disclosure.

Figure 1A:
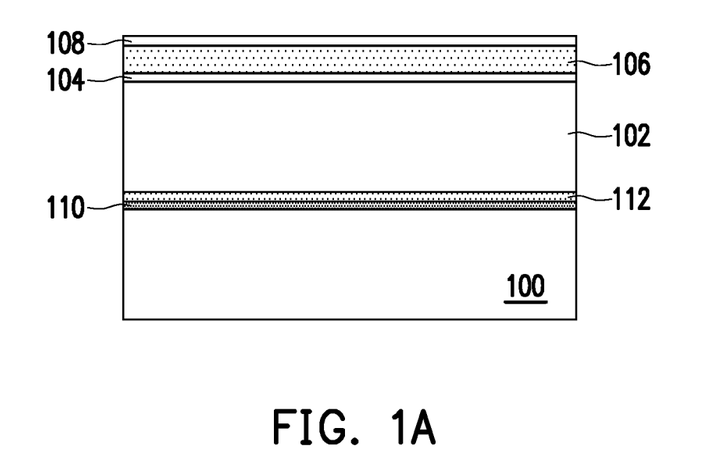
FIGS. 1A-1G are schematic cross-sectional views showing a manufacturing process of a gate structure for a gallium nitride HEMT according to an embodiment of the disclosure.

Referring to FIG. 1A, a channel layer 102, a barrier layer 104, a doped gallium nitride layer 106, and an undoped gallium nitride layer 108 are formed orderly on a substrate 100, wherein the substrate 100 is sapphire, silicon carbide (SiC), zinc oxide (ZnO), silicon (Si), gallium oxide ($Ga_2O_3$), etc. The material of the channel layer 102 is, for example, gallium nitride (GaN). The material of the barrier layer 104 is, for example, aluminum gallium nitride (AlGaN). In the present embodiment, the method of forming the channel layer 102, the barrier layer 104, the doped gallium nitride layer 106, and the undoped gallium nitride layer 108 includes, for example, metal organic chemical vapor deposition (MOCVD) or other epitaxial process. In an embodiment, the thickness of the undoped gallium nitride layer 108 is, for example, less than 200 angstroms. In addition, before forming the channel layer 102, a first buffer layer 110 and a second buffer layer 112 may be formed on the substrate 100, wherein the lattice of the second buffer layer 112 is more matching with the channel layer 102 than the lattice of the first buffer layer 110, thereby solving the lattice mismatch problem between the substrate 100 and the channel layer 102. In an embodiment, the first buffer layer is, for example, an aluminum nitride layer, and the second buffer layer is, for example, a multi-stack layer of aluminum gallium nitride ($Al_xGa_{1-x}N$, x=0.2-1) and gallium nitride. Moreover, the method of forming the first and second buffer layers 110 and 112 may also be a metal organic chemical vapor deposition (MOCVD) or other epitaxial process. Therefore, each layer on the substrate 100 can be grown through the same epitaxial process and the film layer can be formed by changing process parameters (such as material, gas flow rate, etc.).

Figure 1B:
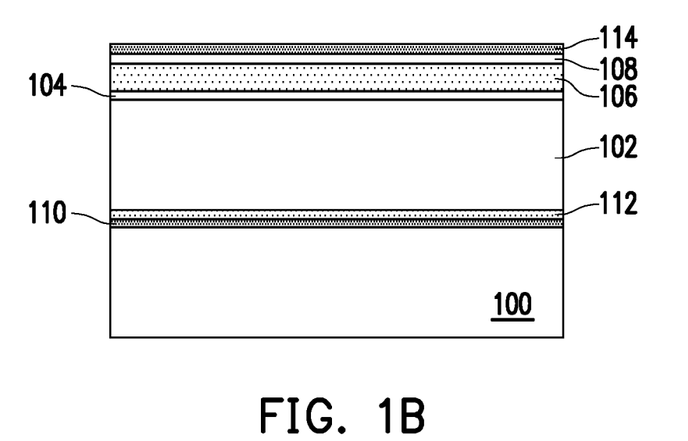

Then, referring to FIG. 1B, an insulating layer 114 is formed on the undoped gallium nitride layer 108, and the material of the insulating layer 114 is, for example, silicon nitride ($Si_3N_4$), aluminum oxide ($Al_2O_3$), silicon oxide ($SiO_2$), boron nitride (BN) or aluminum nitride (AlN), but the disclosure is not limited thereto. The method of forming the insulating layer 114 may be selected from simple low pressure chemical vapor deposition (LPCVD) or metal organic chemical vapor deposition (MOCVD) depending on the material. In an embodiment, the thickness of the insulating layer 114 is, for example, less than 200 angstroms.

Next, referring to FIG. 1C, a trench 116 is formed by removing a portion of the insulating layer, and the formed trench 116 is typically narrower than the subsequently formed gate. The trench 116 is formed by, for example, using a photoresist 118 as an etching mask that etches the insulating layer 114 of FIG. 1B until the undoped gallium nitride layer 108 is exposed, leaving the insulating layer 114a covered by the photoresist 118.

Subsequently, referring to FIG. 1D, after removing the remaining photoresist 118, an entire gate metal layer 120 is formed on the substrate 100, covering the insulating layer 114a and the trench 116, wherein the material of the gate metal layer 120 is, for example, nickel, platinum, tantalum nitride, titanium nitride, tungsten or an alloy of the foregoing metals.

Figure 1C:
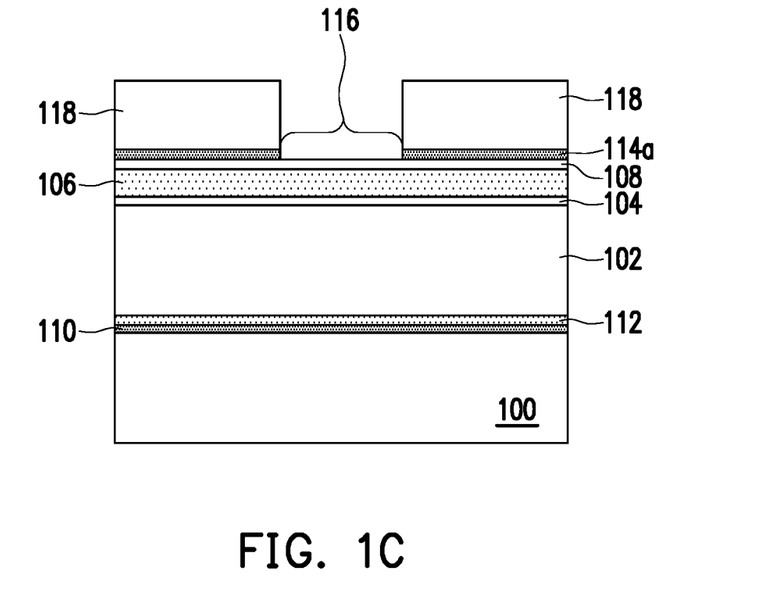
Figure 1D:
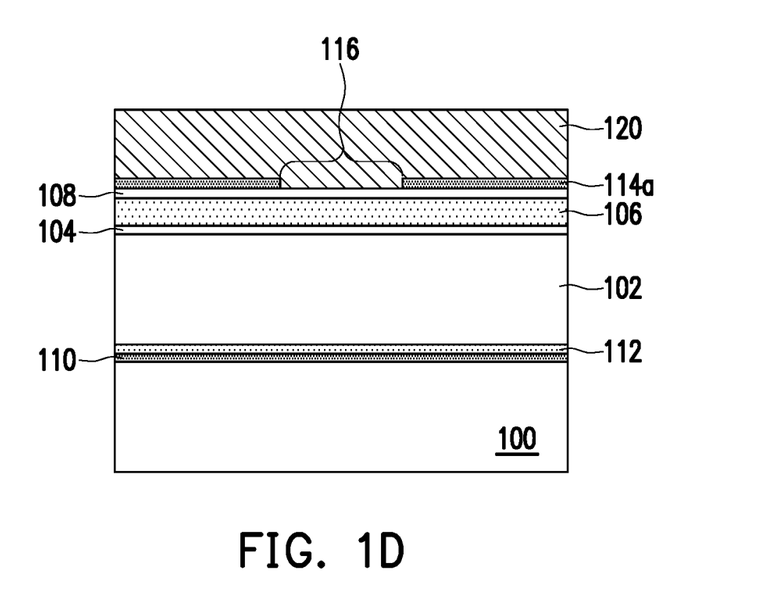
Figure 1E:
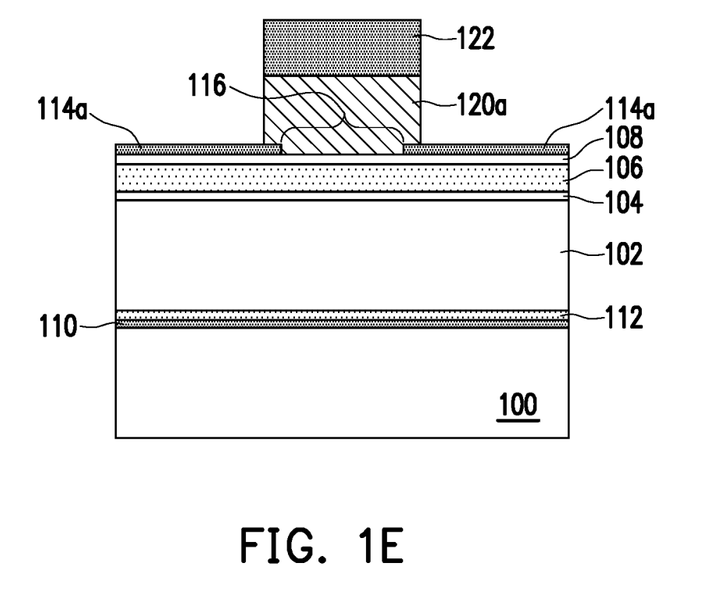

Then, referring to FIG. 1E, a mask layer 122 aligned with the trench 116 is formed on the gate metal layer 120 of FIG. 1D, and the mask layer 122 partially overlaps the insulating layer 114a, so that the mask layer 122 and the photoresist 118 of FIG. 1C substantially exhibit patterns that are almost complementary to each other. In the present embodiment, the mask layer 122 may be a hard mask material such as photoresist or silicon oxide. Then, using the mask layer 122 as an etching mask, the exposed gate metal layer is removed, and the gate metal layer 120a covered by the mask layer 122 is left. In an embodiment, the overlapping area of the mask layer 122 and the insulating layer 114a accounts for 50% or less of the area of the mask layer 122, for example, 30% or less or 20% or less. Since the insulating layer 114a is used to block the sidewall leakage of the gate metal layer 120a, it will suffice as long as the position of the insulating layer 114a is disposed on both sides of the gate metal layer 120a, and the area ratio of the insulating layer 114a is set on basis of not affecting the operation of elements, and thus not limited to the above range.

Figure 1F:
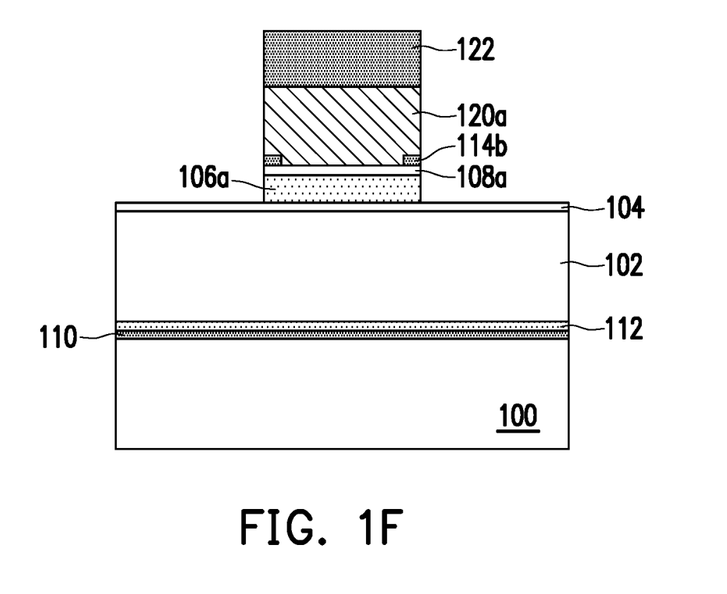

Next, referring to FIG. 1F, the mask layer 122 is used as an etching mask to continuously remove the insulating layer 114a, the undoped gallium nitride layer 108, and the doped gallium nitride layer 106 under the gate metal layer 120a (in FIG. 1E), thereby obtaining a gate structure containing an etched insulating layer 114b, an undoped gallium nitride layer 108a, and a doped gallium nitride layer 106a.

Figure 1G:
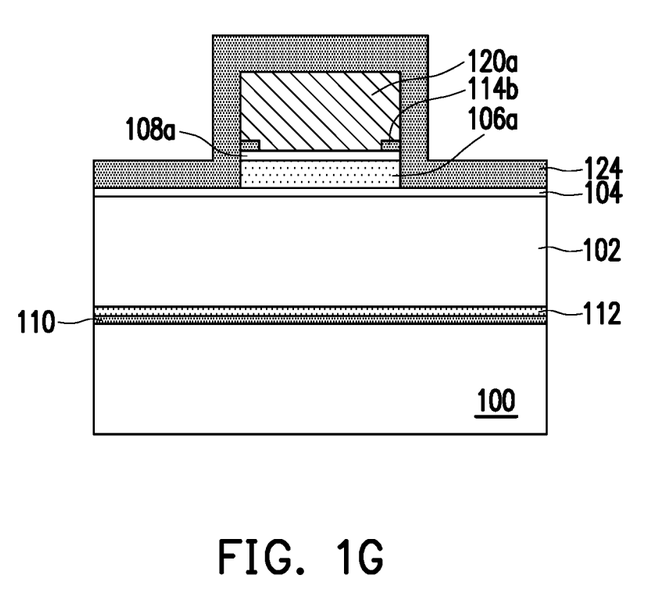

Then, referring to FIG. 1G, the mask layer 122 of FIG. 1F is removed. After the step of removing the mask layer, a passivation layer 124 may further be formed to completely cover the gate metal layer 120a, the insulating layer 114b, the undoped gallium nitride layer 108a, the doped gallium nitride layer 106a and the barrier layer 104. The material of the passivation layer 124, such as silicon nitride or silicon oxide, serves to release the surface stress of the substrate 100.

To manufacture a gallium nitride HEMT, a source metal and a drain metal may be formed on the substrate 100 after the gate structure is formed.

FIGS. 2A-2D are schematic cross-sectional views showing a manufacturing process of a gate structure for a gallium nitride HEMT according to another embodiment of the disclosure, wherein the same or similar components are denoted by the same reference numerals used in the previous embodiment, and the omitted technical descriptions, such as the position of each layer or region, size, material, doped or not, function, etc. may be derived from the contents of FIGS. 1A-1G, and thus related descriptions are omitted herein.

Figure 2A:
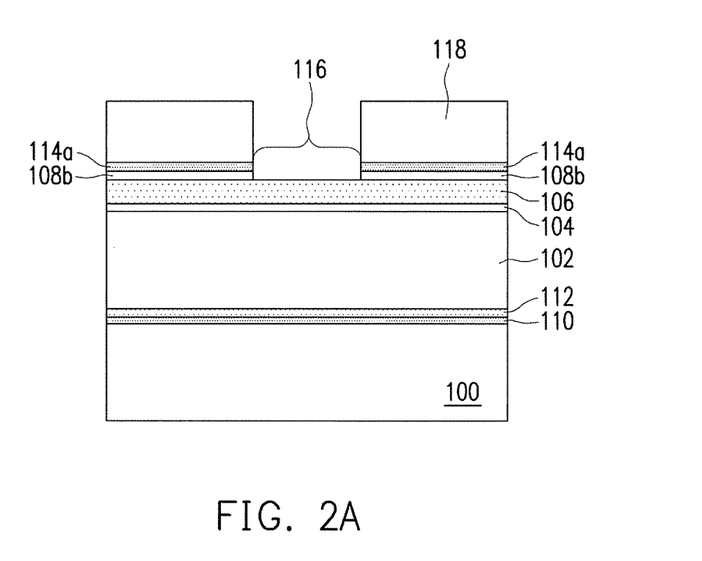
FIGS. 2A-2D are schematic cross-sectional views showing a manufacturing process of a gate structure for a gallium nitride HEMT according to another embodiment of the disclosure.

Referring to FIG. 2A, the manufacturing process of this embodiment may be derived from FIG. 1A to FIG. 1C in the previous embodiment, and therefore related descriptions are omitted herein. Then, after the etched insulating layer 114a is obtained, the exposed undoped gallium nitride layer 108b may be removed continuously by using the photoresist 118 or the insulating layer 114a as the etching mask to deepen the trench 116 and expose the doped gallium nitride layer 106.

Figure 2B:
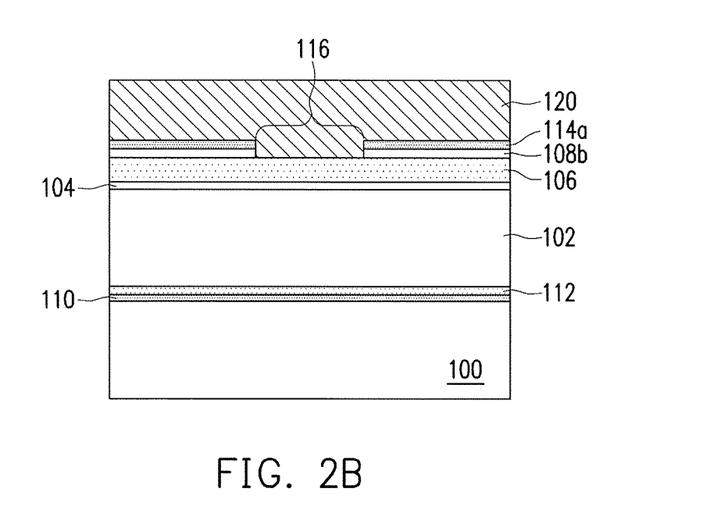

Next, referring to FIG. 2B, after the remaining photoresist 118 is removed, an entire gate metal layer 120 is formed on the substrate 100, covering the insulating layer 114a, the undoped gallium nitride layer 108b and the trench 116, and the formed gate metal layer 120 is in direct contact with the doped gallium nitride layer 106 in the trench 116.

Figure 2C:
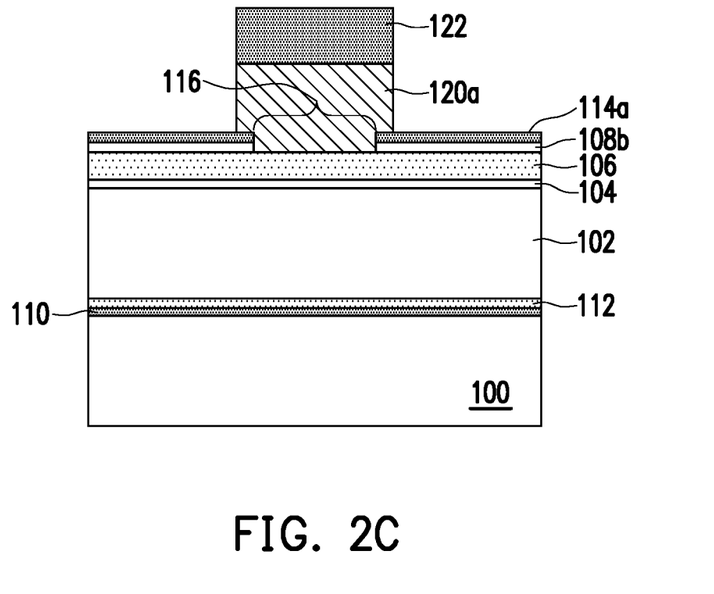

Then, referring to FIG. 2C, a mask layer 122 aligned with the trench 116 is formed on the gate metal layer 120 of FIG. 2B, and the mask layer 122 partially overlaps the insulating layer 114a. Thereafter, the mask layer 122 is used as an etching mask to remove the exposed gate metal layer, leaving the gate metal layer 120a covered by the mask layer 122.

Figure 2D:
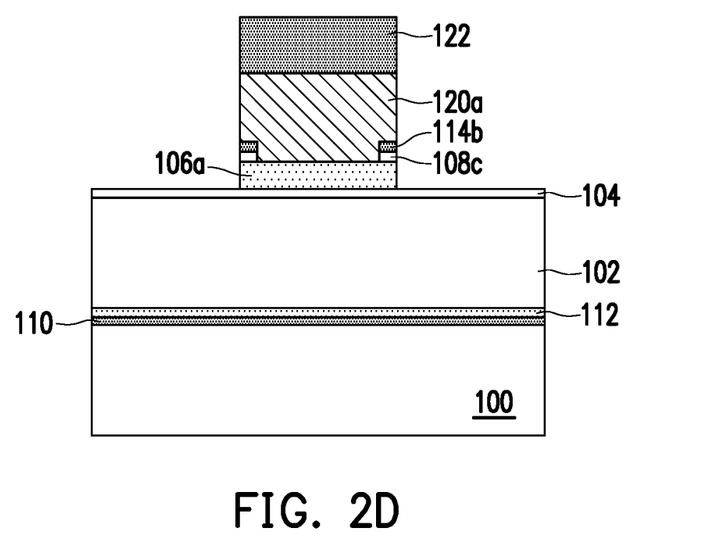

Next, referring to FIG. 2D, the mask layer 122 is used as an etching mask to continuously remove the insulating layer 114a, the undoped gallium nitride layer 108b and the doped gallium nitride layer 106 under the gate metal layer 120a (in FIG. 2C), thereby obtaining a gate structure containing an etched insulating layer 114b, an undoped gallium nitride layer 108c, and a doped gallium nitride layer 106a. Therefore, the undoped gallium nitride layer 108c in this embodiment is disposed between the insulating layer 114b and the doped gallium nitride layer 106a.

In summary, according to the present disclosure, two specific film layers are formed before forming a gate metal layer in combination with a mask manufacturing process to form an insulating layer and an undoped gallium nitride layer under both sides of the gate metal layer. In this manner, it is possible to use the foregoing insulating layer to block current leakage on the side of the gate to reduce gate leakage; and the undoped gallium nitride layer can be used to protect the doped gallium nitride layer which serves as a gate to ensure that the doped gallium nitride layer is not affected by the subsequent manufacturing process of the gate metal layer or source and drain. Therefore, the gate structure manufactured by the present disclosure can improve the reliability of gallium nitride HEMT.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A method of manufacturing a gate structure for a gallium nitride high electron mobility transistor (HEMT), comprising:
    forming a channel layer, a barrier layer, a doped gallium nitride layer, and an undoped gallium nitride layer sequentially on a substrate;
    forming an insulating layer on the undoped gallium nitride layer;
    removing a portion of the insulating layer to form a trench;
    forming a gate metal layer on the substrate to cover the insulating layer and the trench;
    forming a mask layer aligned with the trench on the gate metal layer, and the mask layer partially overlaps the insulating layer;
    removing the exposed gate metal layer and the underlying insulating layer, the undoped gallium nitride layer, and the doped gallium nitride layer by using the mask layer as an etching mask; and
    removing the mask layer.

2. The manufacturing method according to claim 1, wherein an overlapping area of the mask layer and the insulating layer accounts for 50% or less of an area of the mask layer.

3. The manufacturing method according to claim 1, further comprising removing the exposed undoped gallium nitride layer to deepen the trench and expose the doped gallium nitride layer after removing the portion of the insulating layer.

4. The manufacturing method according to claim 3, wherein the gate metal layer is in direct contact with the doped gallium nitride layer in the trench.

5. The manufacturing method according to claim 1, wherein the method of forming the channel layer, the barrier layer, the doped gallium nitride layer, and the undoped gallium nitride layer comprises metal organic chemical vapor deposition.

6. The manufacturing method according to claim 1, wherein the method of forming the insulating layer comprises metal organic chemical vapor deposition or low pressure chemical vapor deposition.

7. The manufacturing method according to claim 1, before forming the channel layer further comprising:
    forming a first buffer layer on the substrate; and
    forming a second buffer layer on the first buffer layer, wherein a lattice of the second buffer layer is more matching with the channel layer than a lattice of the first buffer layer.

8. The manufacturing method according to claim 7, wherein the channel layer is a gallium nitride layer, the first buffer layer is an aluminum nitride layer, and the second buffer layer is a multi-stack layer of aluminum gallium nitride and gallium nitride.

9. The manufacturing method according to claim 7, wherein the method of forming the first buffer layer and the second buffer layer comprises metal organic chemical vapor deposition.

10. The manufacturing method according to claim 1, further comprising forming a passivation layer completely covering the gate metal layer, the insulating layer, the undoped gallium nitride layer, the doped gallium nitride layer, and the barrier layer after removing the mask layer.

* * * * *